(12) United States Patent
Imura et al.

(10) Patent No.: US 11,224,148 B2
(45) Date of Patent: Jan. 11, 2022

(54) CASE, ELECTRONIC DEVICE, AND COOLING METHOD

(71) Applicant: NEC Platforms, Ltd., Kawasaki (JP)

(72) Inventors: Wataru Imura, Kanagawa (JP); Kiyotaka Yokoyama, Kanagawa (JP); Akira Katsumata, Kanagawa (JP); Takahiro Yagi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 56 days.

(21) Appl. No.: 16/620,568

(22) PCT Filed: Jun. 14, 2017

(86) PCT No.: PCT/JP2017/021978
§ 371 (c)(1),
(2) Date: Dec. 9, 2019

(87) PCT Pub. No.: WO2018/229902
PCT Pub. Date: Dec. 20, 2018

(65) Prior Publication Data
US 2021/0153393 A1 May 20, 2021

(51) Int. Cl.
*H05K 7/20* (2006.01)
(52) U.S. Cl.
CPC ................. *H05K 7/20909* (2013.01)
(58) Field of Classification Search
CPC ........... H05K 7/20909; H05K 7/20127; H05K 7/20145; H05K 7/20845
See application file for complete search history.

(56) References Cited

U.S. PATENT DOCUMENTS

| 8,743,540 | B1 | 6/2014 | Nishihara et al. |
| 9,622,390 | B2* | 4/2017 | Hwang ............... H05K 7/20909 |
| 2020/0174533 | A1* | 6/2020 | Long ....................... G06F 1/187 |

FOREIGN PATENT DOCUMENTS

| CN | 103648257 A | 3/2014 |
| JP | S60-147907 U | 10/1985 |
| JP | H11-112177 A | 4/1999 |
| JP | 2000-173259 A | 6/2000 |
| JP | 2002-189207 A | 7/2002 |
| JP | 2003-157669 A | 5/2003 |
| JP | 2005-259787 A | 9/2005 |
| JP | 4002425 B2 | 10/2007 |

(Continued)

OTHER PUBLICATIONS

Chinese Office Action for CN Application No. 201780092077.8 dated Jun. 28, 2020 with English Translation.

(Continued)

*Primary Examiner* — Mukundbhai G Patel
(74) *Attorney, Agent, or Firm* — Sughrue Mion, PLLC

(57) ABSTRACT

A case (2) includes a tubular body (6) extending vertically and a top plate (8) disposed at a top edge of the tubular body (6), the case being capable of accommodating a heat-generating element (5). Upward ventholes (16) for discharging the heated air (P), which is heated by the heat-generating element (5), to the outside are formed in the top plate 8. A partition wall (17) that protrudes downwardly from the top plate (8) is disposed between the upward ventholes (16) and the tubular body (6). An air accumulating part (20) surrounded by the tubular body (6), the top plate (8), and the partition wall (17) is formed.

8 Claims, 8 Drawing Sheets

(56) References Cited

FOREIGN PATENT DOCUMENTS

| JP | 2012-160651 A | 8/2012 |
|----|---------------|--------|
| WO | 2014/118900 A1 | 8/2014 |

OTHER PUBLICATIONS

International Search Report for PCT Application No. PCT/JP2017/021978, dated Sep. 12, 2017.
Japanese Office Action for JP Application No. 2019-524628 dated Feb. 9, 2021 with English Translation.
Japanese Office Communication for JP Application No. 2019-524628 dated Aug. 31, 2021 with English Translation.

* cited by examiner

CASE, ELECTRONIC DEVICE, AND COOLING METHOD

This application is a National Stage Entry of PCT/JP2017/021978 filed on Jun. 14, 2017, the contents of all of which are incorporated herein by reference, in their entirety.

TECHNICAL FIELD

The present invention relates to a case, an electronic device, and a cooling method.

BACKGROUND ART

Patent Literature 1 discloses a technique related to a heat dissipation measure for a case within which a heat-generating element such as a power IC is accommodated. Specifically, an upper venthole and a lower venthole are formed in a top plate part and a bottom plate part of the case, respectively. By this structure, an airflow from the bottom of the heat-generating element toward the top thereof is formed opposing to a space in the vicinity of the heat-generating element.

CITATION LIST

Patent Literature

[Patent Literature 1] Japanese Unexamined Patent Application Publication No. 2003-157669

SUMMARY OF INVENTION

Technical Problem

However, in the structure of Patent Literature 1 mentioned above, there is a problem that the temperature of the top plate part of the case becomes locally high.

Therefore, an object of the present invention is to provide a technique for restraining a temperature of a top plate of a case from becoming locally high in a structure in which a venthole is formed in the top plate of the case.

Solution to Problem

In order to accomplish the aforementioned object, a case according to a first aspect of the present disclosure includes a tubular body extending vertically and a top plate disposed at a top edge of the tubular body, the case capable of accommodating a heat-generating element, in which a venthole for discharging air heated by the heat-generating element to the outside is formed in the top plate, a partition wall protruding downwardly from the top plate is disposed between the venthole and the tubular body, and an air accumulating part surrounded by the tubular body, the top plate, and the partition wall is formed.

Further, a method for cooling a case according to a second aspect of the present disclosure includes a tubular body extending vertically and a top plate disposed at a top edge of the tubular body, the case being capable of accommodating a heat-generating element, the method including: forming a venthole for discharging air heated by the heat-generating element to outside in the top plate; disposing a partition wall that protrudes downwardly from the top plate between the venthole and the tubular body; and forming an air accumulating part surrounded by the tubular body, the top plate, and the partition wall is provided.

Advantageous Effects of Invention

According to the present invention, it is possible to restrain a temperature of a top plate of a case from becoming locally high in a structure in which a venthole is formed in the top plate of the case.

DESCRIPTION OF EMBODIMENTS

First Example Embodiment

Hereinbelow, a first example embodiment of the present invention is explained with reference to the figures.

Figure 1:
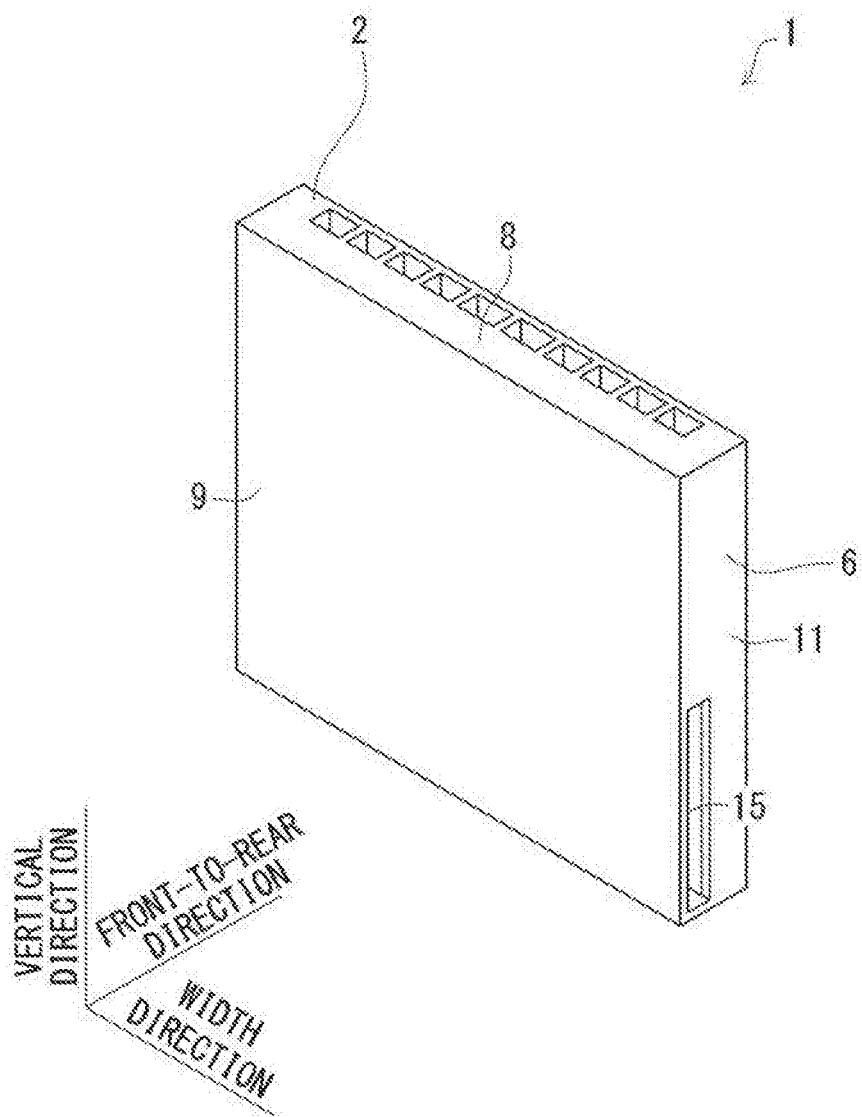
FIG. 1 is a perspective view of an electronic device according to a first example embodiment.
Figure 2:
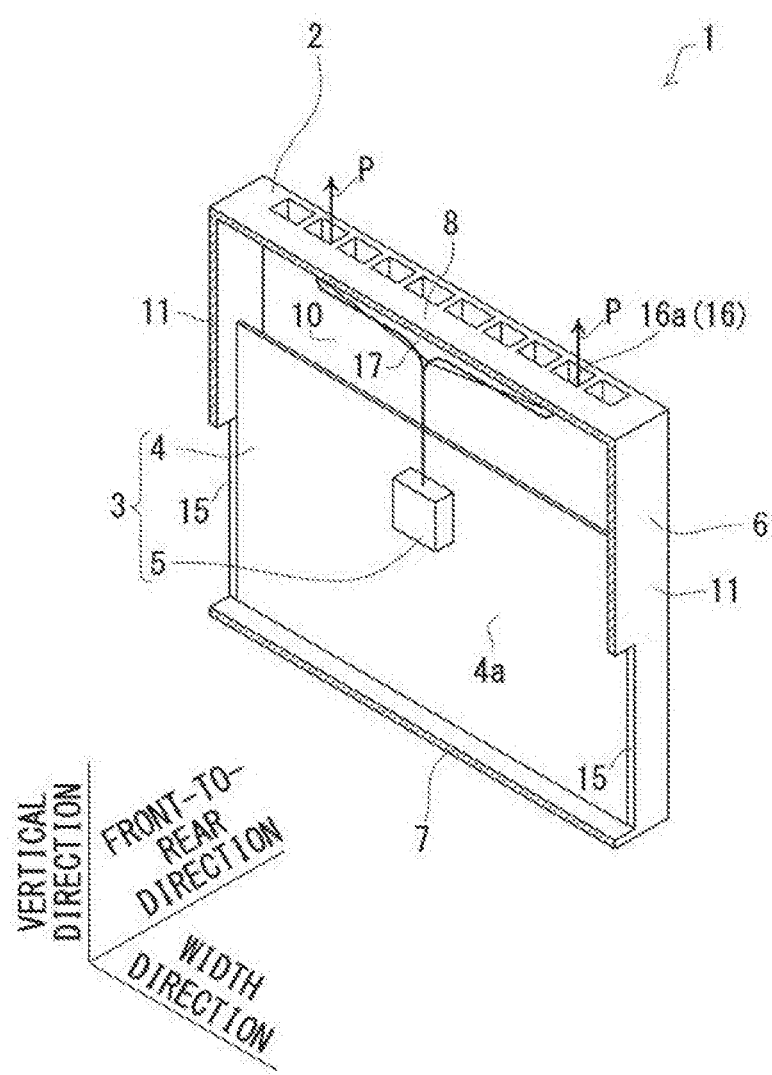
FIG. 2 is a partially cut-out perspective view of the electronic device according to the first example embodiment.
Figure 3:
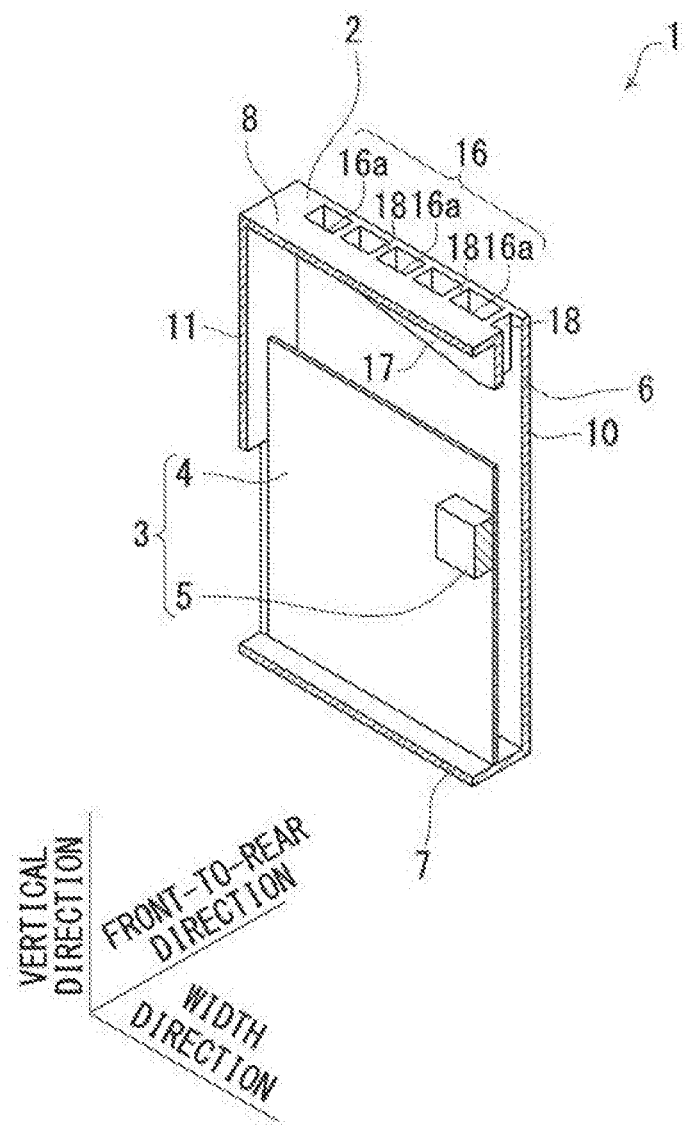
FIG. 3 is a partially cut-out perspective view of the electronic device according to the first example embodiment.
Figure 4:
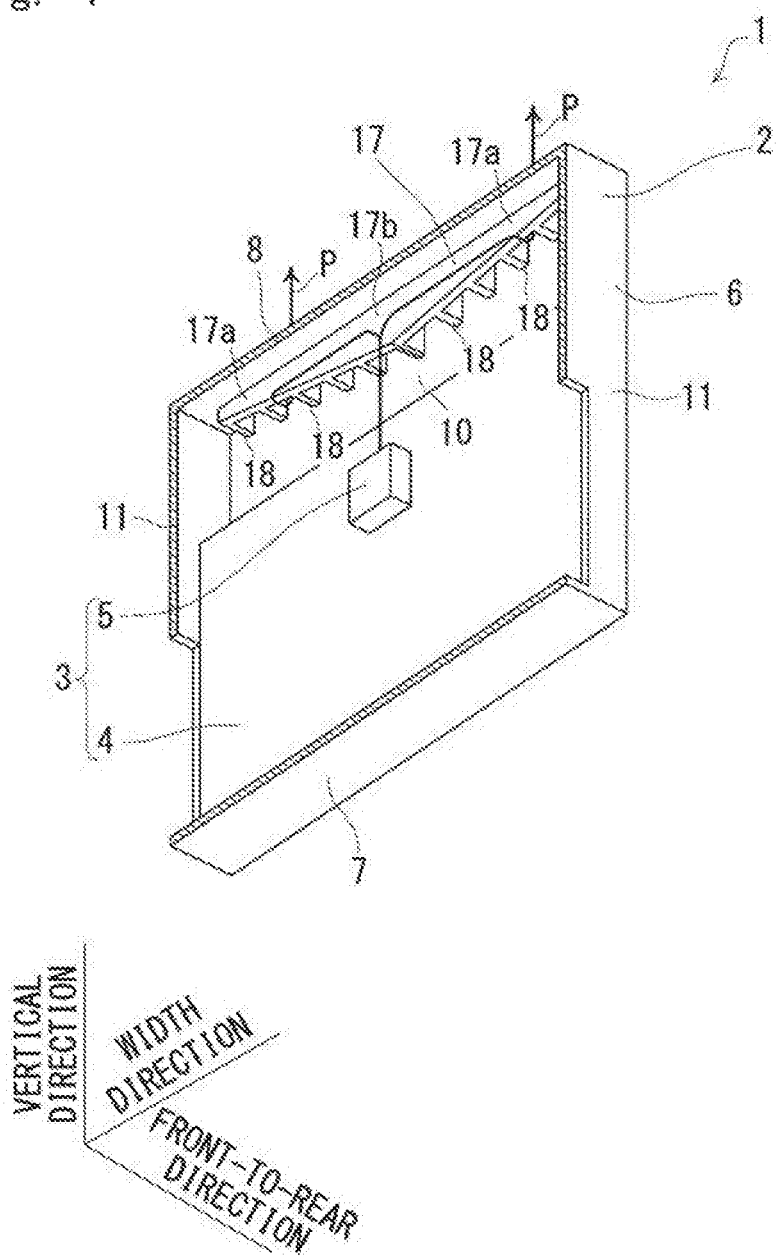
FIG. 4 is a partially cut-out perspective view of the electronic device according to the first example embodiment.
Figure 5:
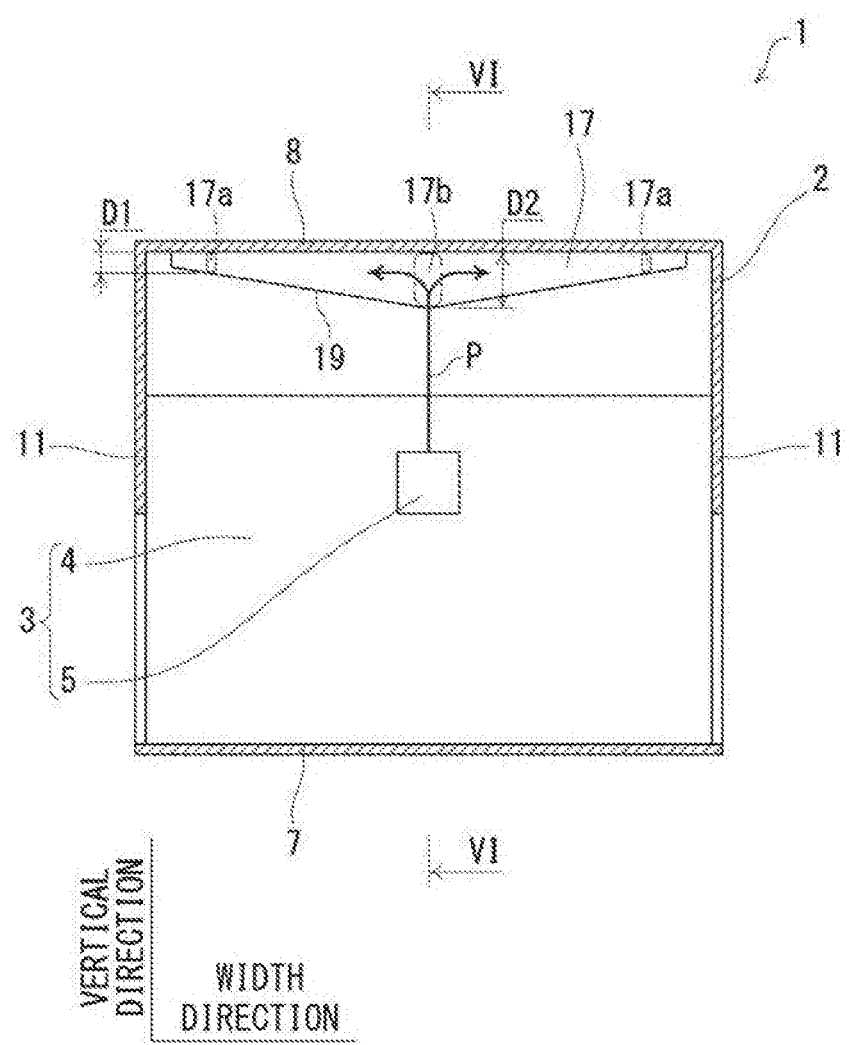
FIG. 5 is a front sectional diagram of the electronic device according to the first example embodiment.
Figure 6:
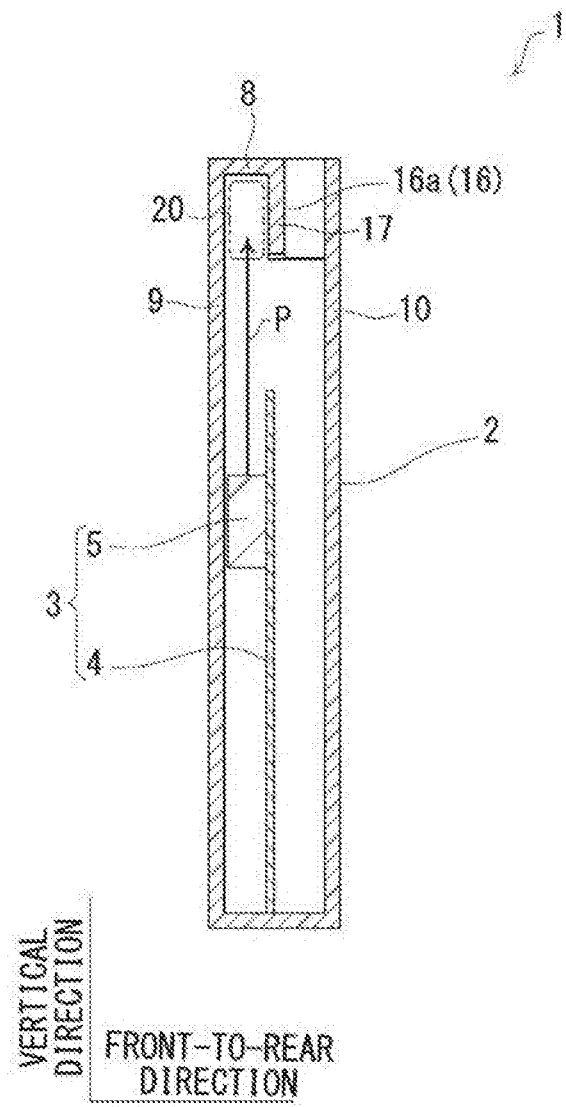
FIG. 6 is a side sectional diagram of the electronic device according to the first example embodiment.

FIG. 1 is a perspective view of an electronic device 1. FIGS. 2 to 4 are partially cut-out perspective views of the electronic device 1. FIG. 5 is a front sectional diagram of the electronic device 1. FIG. 6 is a side sectional diagram of the electronic device 1.

As shown in FIGS. 1 to 4, the electronic device 1 includes a case 2 and an electronic device main body 3. As shown in FIG. 2, the electronic device main body 3 includes a wiring board 4 and a heat-generating element 5.

As shown in FIGS. 1 to 4, the case 2 has a rectangular box-shape. That is, the case 2 has a rectangular tubular body 6 extending vertically, a rectangular bottom plate 7 disposed at a bottom edge of the tubular body 6, and a rectangular top plate 8 disposed at a top edge of the tubular body 6. The rectangular tubular body 6 includes four side plates. That is, the rectangular tubular body 6 includes a front panel 9 (a side plate on the front side thereof), a rear panel 10 (a side plate on the rear side thereof), and two side panels 11 (side plates on the sides thereof) opposing each other.

Hereinbelow, a direction in which the front panel 9 and the rear panel 10 oppose each other is referred to as a "front-to-rear direction" in the present specification. Regarding the front-to-rear direction, a direction in which the front panel 9 is seen from the rear panel 10 is referred to as a "forward" direction and a direction in which the rear panel 10 is seen from the front panel 9 is referred to as a "rearward" direction. A direction in which the two side panels 11 oppose each other is referred to as a "width direction". Further, a direction in which the bottom plate 7 opposes the top plate 8 is referred to as a "vertical direction". Regarding the vertical direction, a direction in which the top plate 8 is seen from the bottom plate 7 is referred to as an "upward" direction and a direction in which the bottom plate 7 is seen from the top plate 8 is referred to as a "downward" direction. A "front edge" and a "rear edge" refer to a "forward edge" and a "rearward edge", respectively. The "top edge" and the "bottom edge" refer to an "upper edge" and a "lower edge", respectively. In the present example embodiment, the front-to-rear direction and the width direction are orthogonal to each other, and the front-to-rear direction and the vertical direction are orthogonal to each other.

As shown in FIG. 1, in the present example embodiment, the case 2 is structured such that it is flat in the front-to-rear direction. That is, a dimension of the case 2 in the front-to-rear direction is smaller than a dimension thereof in the width direction.

As shown in FIG. 2, the case 2 accommodates the electronic device main body 3 therein. The wiring board 4 has a thin-plate like shape, the thickness direction thereof being in parallel to the front-to-rear direction. The wiring board 4 is disposed such that it comes into contact with the bottom plate 7 and the two side panels 11. The wiring board 4 is disposed apart from the top plate 8. That is, there is a gap between the wiring board 4 and the top plate 8.

The heat-generating element 5 is mounted on a component mounting surface 4a of the wiring board 4. The heat-generating element 5 is disposed in the middle of the wiring board 4 in the width direction. The component mounting surface 4a is a surface facing forward. The heat-generating element 5 is, for example, a power semiconductor device that generates a large amount of heat.

Further, as shown in FIGS. 1 and 2, a sideward venthole 15 is formed in each of the two side panels 11. The sideward venthole 15 is formed closer to the forward side than the component mounting surface 4a of the wiring board 4 is. Accordingly, outside air taken in from the sideward venthole 15 can be supplied directly to the heat-generating element 5.

Next, a structure of the case 2 in a periphery of the top plate 8 is explained in detail.

As shown in FIGS. 3 and 4, the case 2 further includes upward ventholes 16 (ventholes), a partition wall 17, and a plurality of reinforcement ribs 18.

As shown in FIG. 3, the upward ventholes 16 are ventholes for discharging air heated by the heat-generating element 5 to the outside and are formed in the top plate 8. The upward ventholes 16 penetrate vertically through the top plate 8. The upward ventholes 16 are formed such that they are located closer to the rear panel 10. The upward ventholes 16 are composed of a plurality of upward penetrating holes 16a aligned at regular intervals in the width direction. That is, the upward ventholes 16 are partitioned by the plurality of reinforcement ribs 18. The plurality of reinforcement ribs 18 can be omitted. In the case of omitting the plurality of reinforcement ribs 18, one upward venthole 16 is formed in an elongated manner in the width direction.

As shown in FIGS. 3 and 4, the partition wall 17 and the plurality of ribs 18 are disposed inside the tubular body 6.

The partition wall 17 is formed such that it protrudes downwardly from the top plate 8. The partition wall 17 has a flat-plate like shape the thickness direction thereof being in parallel to the front-to-rear direction. The partition wall 17 is disposed between the upward ventholes 16 and the front panel 9. The partition wall 17 is disposed such that it recedes from the front panel 9 toward the rearward side. The partition wall 17 is disposed such that it recedes from the rear panel 10 toward the forward side.

As shown in FIG. 5, a bottom edge 19 of the partition wall 17 is slanted in a V-shape as viewed in the thickness direction of the partition wall 17 so that it is the lowest at the midpoint in the width direction and becomes gradually higher as it recedes from the midpoint in the width direction. That is, the partition wall 17 has a partition wall lower part 17a (a first partition wall part) and a partition wall higher part 17b (a second partition wall part), in which a distance of the partition wall lower part 17a from the top plate 8 to the bottom edge 19 of the partition wall 17 is a first distance D1 and a distance of the partition wall higher part 17b from the top plate 8 to the bottom edge 19 of the partition wall 17 is a second distance D2. Here, the second distance D2 is longer than the first distance D1. Further, the bottom edge 19 of the partition wall 17 is slanted linearly from the partition wall higher part 17b up to the partition wall lower part 17a. In this example embodiment, since the partition wall higher part 17b is a part at a midpoint in the width direction of the partition wall 17, it is located closer to the heat-generating element 5, which is disposed at the midpoint in the width direction of the wiring board 4, than the partition wall lower part 17a is. That is, the partition wall higher part 17b is disposed right directly above the heat-generating element 5 as viewed in the thickness direction of the partition wall 17. The partition wall 17 is disposed between two side panels 11 and is formed such that it extends in the width direction. However, in the present example embodiment, two edges of the partition wall 17 in the width direction are slightly apart from the two side panels 11, respectively. This structure is adopted in consideration given to easiness of assembling of the case 2, and each of the two edges of the partition wall 17 in the width direction may come in contact with each of the two side panels 11 or may be formed uniformly therewith.

As shown in FIGS. 3 and 4, the plurality of reinforcement ribs 18 are formed so as to extend from the partition wall 17 up to the rear panel 10 so as to cross over the upward ventholes 16 in the front-to-rear direction. The rigidity of the case 2 in the front-to-rear direction is ensured by providing the plurality of reinforcement ribs 18. The plurality of reinforcement ribs 18 are arranged at regular intervals in the width direction. Each of the plurality of reinforcement ribs 18 is disposed such that the thickness direction thereof is parallel to the width direction. The plurality of reinforcement ribs 18 divide the upward ventholes 16 into a number of ventholes in the width direction. Accordingly, as described above, the upward ventholes 16 are divided into the plurality of upward penetrating holes 16a by the plurality of reinforcement ribs 18.

In the structure mentioned above, when electricity is supplied to the heat-generating element 5, air heated by the heat-generating element 5 (hereinbelow referred to as heated air P) rises, and the heated air P reaches an air accumulating part 20 surrounded by the front panel 9, the top plate 8, and the partition wall 17 as shown in FIG. 6. The heated air P that has reached the air accumulating part 20 collides with the top plate 8, so that it is divided into two flowing in the width direction and they move toward the two side panels 11, respectively, as shown in FIG. 5. The heated air P is temporarily accumulated in the air accumulating part 20, so that it is cooled by being heat-exchanged with outside air through the top plate 8.

Further, since the bottom edge 19 of the partition wall 17 is slanted toward the top plate 8 as it gets closer to either one of the two side panels 11, the heated air P climbs over the partition wall 17 at a position sufficiently away from the partition wall 17b as shown in FIG. 4 and is discharged to the outside from the upward penetrating holes 16a as shown in FIG. 2.

Therefore, in the present example embodiment, since the heated air P which has been heated by the heat-generating element 5 is temporarily accumulated in the air accumulating part 20, heat is diffused in the width direction in the air accumulating part 20 and then the heated air P is discharged from the upward ventholes 16 after being diffused. Accordingly, it is possible to restrain the temperature of the top plate 8 from becoming locally high. Further, owing to the gradient of the bottom edge 19 of the top plate 8, the flow of the heated air P in the width direction in the air accumulating portion 20 is accelerated, so that thermal diffusion is accelerated. Therefore, it is possible to restrain the temperature of the top plate 8 from becoming locally high more effectively.

The first example embodiment has been explained above, and the first example embodiment described above has the following features.

As shown in FIGS. 1 to 4, the case 2 includes the tubular body 6 that extends vertically and the top plate 8 disposed at the top edge of the tubular body 6, and is capable of accommodating the heat-generating element 5. The upward ventholes 16 (ventholes) for discharging the heated air P, which is heated by the heat-generating element 5, to the outside are formed in the top plate 8. The partition wall 17 that protrudes downwardly from the top plate 8 is disposed between the upward ventholes 16 and the tubular body 6. The air accumulating part 20 surrounded by the tubular body 6, the top plate 8, and the partition wall 17 is formed. In the aforementioned structure, the heated air P is accumulated in the air accumulating part 20, and then climbs over the partition wall 17 and is discharged from the upward ventholes 16. In the aforementioned structure, since the heated air P is accumulated in the air accumulating part 20 and then climbs over the partition wall 17 to be discharged from the upward ventholes 16, it is possible to restrain the temperature of the top plate 8 from becoming locally high owing to the effect of the thermal diffusion as compared to the case where the heated air P is discharged directly from the upward ventholes 16.

Further, as shown in FIG. 1 to 4, the tubular body 6 has a rectangular tubular shape. However, the tubular body 6 may have a cylindrical shape.

Further, the partition wall 17 has a flat-plate like shape as shown in FIGS. 3 and 4. However, the partition wall 17 may have a curved shape. Further, when the upward ventholes 16 are disposed apart from the tubular body 6, the partition wall 17 may have a cylindrical shape surrounding the upward ventholes 16.

Further, as shown in FIGS. 3 and 4, in the case 2, the plurality of reinforcement ribs 18 extending from the partition wall 17 up to the tubular body 6 are disposed so as to cross over the upward ventholes 16. In the aforementioned structure, the rigidity of the case 2 in the front-to-rear direction can be ensured. However, instead of providing the plurality of reinforcement ribs 18, only one reinforcement rib, or two or three reinforcement ribs may be provided. That is, it is preferable to provide at least one reinforcement rib. However, the reinforcement ribs 18 can be omitted.

Further, as shown in FIG. 5, the partition wall 17 has the partition wall lower part 17a (the first partition wall part) and the partition wall higher part 17b (the second partition wall part), in which the distance of the partition wall lower part 17a from the top plate 8 to the bottom edge 19 of the partition wall 17 is the first distance D1 and the distance of the partition wall higher part 17b from the top plate 8 to the bottom edge 19 of the partition wall 17 is the second distance D2 which is longer than the first distance D1. In the aforementioned structure, the heated air P can climb over the partition wall lower part 17a more easily than the partition wall higher part 17b. Accordingly, it is possible to flexibly control the flow of air when the heated air P climbs over the partition wall 17 while flowing from the air accumulating part 20 toward the upward ventholes 16.

Further, the bottom edge 19 of the partition wall 17 is slanted linearly from the partition wall higher part 17b up to the partition wall lower part 17a as shown in FIG. 5. In the aforementioned structure, it is possible to make the flow rate of the heated air P discharged from the upward ventholes 16 uniform in the width direction. However, instead of the aforementioned structure, the bottom edge 19 of the partition wall 17 may be slanted in a curved manner from the partition wall higher part 17b up to the partition wall lower part 17a.

Further, as shown in FIGS. 2 to 4, the electronic device 1 includes the case 2 and the heat-generating element 5. As shown in FIG. 5, the partition wall higher part 17b is disposed closer to the heat-generating element 5 than the partition wall lower part 17a is. In the aforementioned structure, the heated air P can be restrained from climbing over the partition wall 17 immediately after it enters the air accumulating part 20 and thus, it is possible to restrain the temperature of the top plate 8 from becoming locally high more effectively.

Further, a method of cooling the case 2 that includes the tubular body 6 that extends vertically and the top plate 8 disposed at the top edge of the tubular body 6, and is capable of accommodating the heat-generating element 5, includes a step of forming the upward ventholes 16 for discharging the heated air P to the outside in the top plate 8, a step of disposing the partition wall 17 that protrudes downwardly from the top plate 8 between the upward ventholes 16 and the tubular body 6, and a step of forming the air accumulating part 20 surrounded by the tubular body 6, the top plate 8, and the partition wall 17.

Second Example Embodiment

Hereinbelow, a second example embodiment according to the present invention is explained with reference to FIGS. 7 and 8. Hereinbelow, explanation is given on the differences between the present example embodiment and the first example embodiment, and duplicated explanations are omitted.

Figure 7:
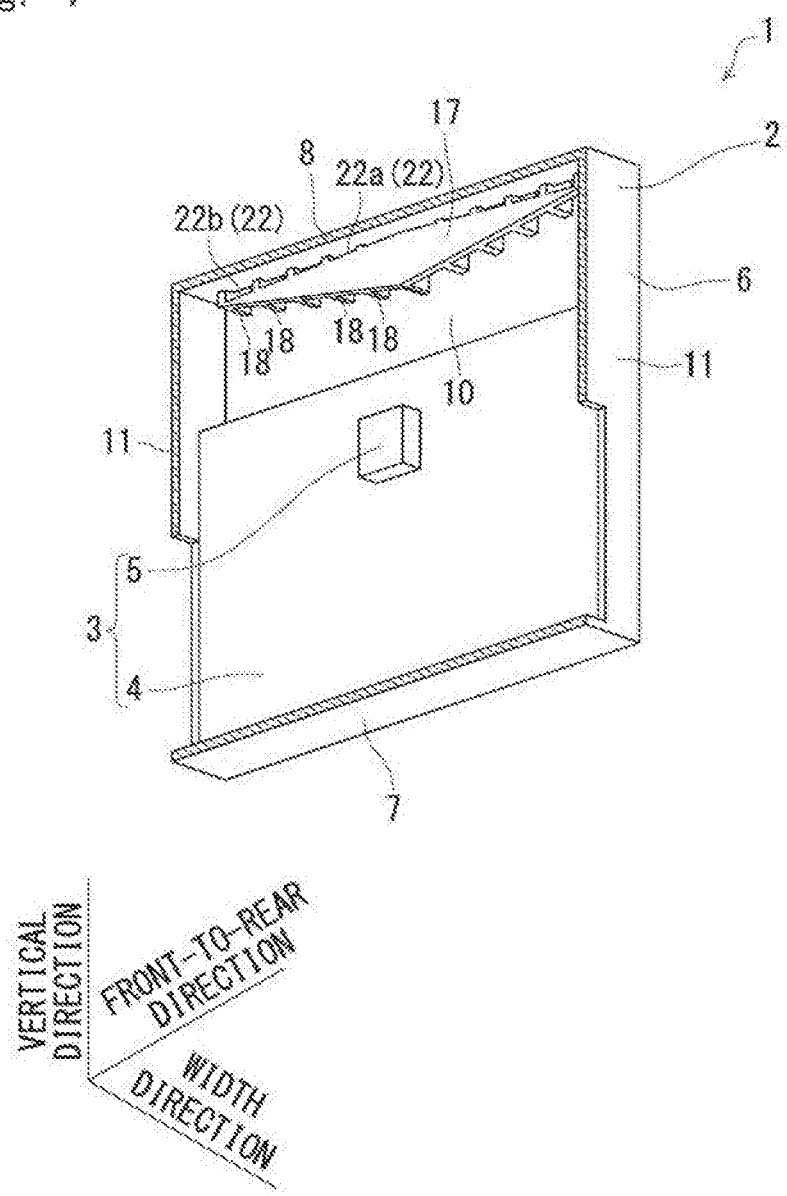
FIG. 7 is a partially cut-out perspective view of an electronic device according to a second example embodiment.
Figure 8:
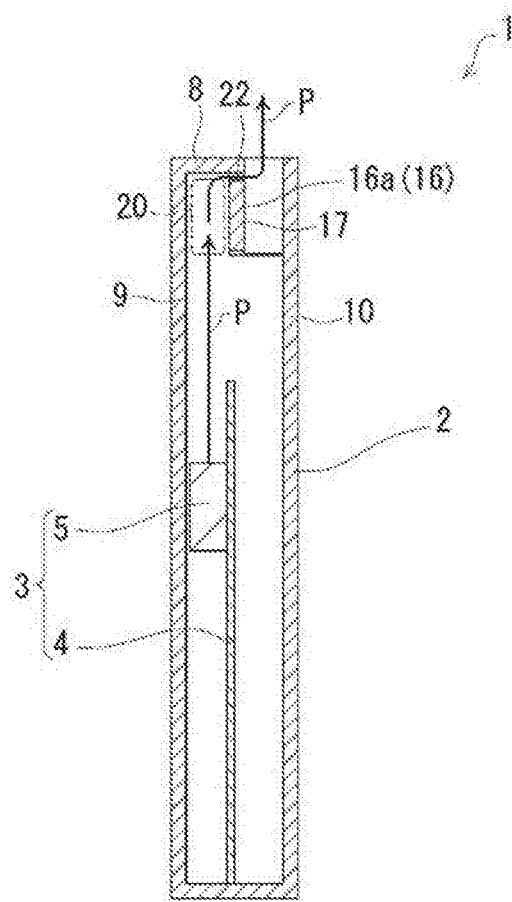
FIG. 8 is a side sectional diagram of the electronic device according to the second example embodiment.

FIG. 7 is a partially cut-out perspective view of the electronic device 1. FIG. 8 is a side sectional diagram of the electronic device 1.

As shown in FIG. 7, in the present example embodiment, a plurality of partition wall penetrating holes 22 that penetrate through the partition wall 17 in the front-to-rear direction are formed. The plurality of partition wall penetrating holes 22 are formed at an upper edge of the partition wall 17 and are aligned at regular intervals in the width direction. In the present example embodiment, one partition wall penetrating hole 22 is formed between two reinforcement ribs 18 that are adjacent to each other in the width direction. Further, an area of an opening of each of the plurality of partition wall penetrating holes 22 differs depending on the distance between that hole and a respective one of the side panels 11. That is, the plurality of partition wall penetrating holes 22 include partition wall small penetrating holes 22a (second penetrating holes) and partition wall large penetrating holes 22b (first penetrating holes). An area of an opening of the partition wall large penetrating holes 22b is larger than an area of an opening of the partition wall small penetrating holes 22a. In other words, the partition wall large penetrating holes 22b and the partition wall small penetrating holes 22a are formed in the partition wall 17, the area of the opening of each of the partition wall small penetrating holes 22a being smaller than the area of the opening of each of the partition wall large penetrating holes 22b. Further, the plurality of partition wall penetrating holes 22 are formed at different positions in the longitudinal direction of the upper edge of the partition wall 17. That is, the partition wall small penetrating holes 22a and the partition wall large penetrating holes 22b are formed at different positions in the width direction. The area of the opening of each partition wall penetrating hole 22 is set so that the area becomes larger as it gets closer to a respective one of the side panels 11. The area of the opening of each partition wall penetrating hole 22 is set so that the area becomes smaller as it gets closer to the midpoint in the width direction. Further, the partition wall small penetrating holes 22a are disposed closer to the heat-generating element 5 than the partition wall large penetrating holes 22b are.

In the structure mentioned above, as shown in FIG. 8, as a route through which the heated air P that is temporarily accumulated in the air accumulating part 20 is discharged from the upward ventholes 16, a route that passes through the partition wall 17 via the partition wall penetrating holes 22 and reaches the upward ventholes 16 is provided in addition to a route that climbs over the partition wall 17 and reaches the upward ventholes 16. Further, by making the areas of the openings of the plurality of partition wall penetrating holes 22 different from each other, it is possible to separately adjust the flow rates of the heated air P flowing through the routes that pass through the partition wall 17 via the respective partition wall penetrating holes 22. Accordingly, the routes through which the heated air P that is temporarily accumulated in the air accumulating part 20 is discharged from the upward ventholes 16 can be diversified, and therefore it is possible to realize the thermal diffusion of the heated air P at a high level.

The second example embodiment has been explained above, and the second example embodiment has the following features.

As shown in FIG. 7, the partition wall large penetrating holes 22b (the first penetration holes) and the partition wall small penetrating holes 22a (the second penetration holes) are formed in the partition wall 17, the area of the opening of each of the partition wall small penetrating hole 22a being smaller than the area of the opening of each of the partition wall large penetrating hole 22b. The partition wall large penetrating holes 22b and the partition wall small penetrating holes 22a are formed at different positions in the longitudinal direction of the upper edge of the partition wall 17. In the aforementioned structure, the heated air P can pass through the partition wall large penetrating holes 22b more easily than to the partition wall small penetrating holes 22a. Accordingly, it is possible to flexibly control the flow of air when the heated air P flows from the air accumulating part 20 toward the upward ventholes 16.

Further, as shown in FIG. 7, the electronic device 1 includes the case 2, and the heat-generating element 5. The partition wall small penetrating holes 22a are disposed closer to the heat-generating element 5 than the partition wall large penetrating holes 22b are. In the aforementioned structure, the heated air P can be restrained from passing through the partition wall 17 immediately after it enters the air accumulating part 20 and thus, it is possible to restrain the temperature of the top plate 8 from becoming locally high more effectively.

Note that the present invention is not limited to the example embodiments mentioned above and can be varied as appropriate without departing from the gist of the present invention. For example, it is possible to structure the tubular body 6 to have a cylindrical shape, form the upward vent holes 16 in the middle of the top plate 8 in a radial direction, and form the partition wall 17 such that it surrounds the upward vent holes 16.

REFERENCE SIGNS LIST

1 ELECTRONIC DEVICE
2 CASE
3 ELECTRONIC DEVICE MAIN BODY
4 WIRING SUBSTRATE
4a COMPONENT MOUNTING SURFACE
5 HEAT-GENERATING ELEMENT
6 CASE
7 BOTTOM BOARD
8 TOP BOARD
9 FRONT PANEL
10 REAR PANEL
11 SIDE PANEL
15 SIDEWARD VENT HOLE
16 UPWARD VENT HOLE
16A UPWARD PENETRATING HOLE
17 PARTITION WALL
17a PARTITION WALL LOWER PART
17b PARTITION WALL HIGHER PART
18 REINFORCEMENT RIB
19 BOTTOM END
20 AIR ACCUMULATING PART
22 PARTITION WALL PENETRATING HOLE
22a PARTITION WALL SMALL PENETRATING HOLE
22b PARTITION WALL LARGE PENETRATING HOLE
D1 FIRST DISTANCE
D2 SECOND DISTANCE P HEATED AIR
P HEATED AIR

What is claimed is:
1. A case comprising:
a tubular body extending vertically; and
a top plate disposed at a top edge of the tubular body, the case being capable of accommodating a heat-generating element therein, wherein
a venthole for discharging air heated by the heat-generating element to the outside is formed in the top plate,
a partition wall protruding downwardly from the top plate is disposed between the venthole and the tubular body, the partition wall being perpendicular with the top plate and a top edge of the partition wall being entirely fixed to the top plate, and
an air accumulating part surrounded by the tubular body, the top plate, and the partition wall is formed, wherein
the partition wall comprises:
a first partition wall part, a distance of the first partition wall part from the top plate to a bottom edge of the partition wall being a first distance; and
a second partition wall part, a distance of the second partition wall part from the top plate to the bottom edge of the partition wall being a second distance longer than the first distance.
2. The case according to claim 1, wherein the tubular body has a rectangular tubular shape or a cylindrical shape.

3. The case according to claim 1, wherein the partition wall has a flat-plate like shape, a curved shape, or a cylindrical shape surrounding the venthole.

4. The case according to claim 1, wherein at least one reinforcement rib extending from the partition wall up to the tubular body is disposed so as to cross over the venthole.

5. The case according to claim 1, wherein the bottom edge of the partition wall is slanted linearly or in a curved manner from the second partition wall part up to the first partition wall part.

6. An electronic device comprising:
the case according to claim 1; and
a heat-generating element, wherein
the second partition wall part is disposed closer to the heat-generating element than the first partition wall part is.

7. A case comprising:
a tubular body extending vertically; and
a top plate disposed at a top edge of the tubular body, the case being capable of accommodating a heat-generating element therein, wherein
a venthole for discharging air heated by the heat-generating element to the outside is formed in the top plate,
a partition wall protruding downwardly from the top plate is disposed between the venthole and the tubular body,
an air accumulating part surrounded by the tubular body, the top plate, and the partition wall is formed,
a first penetrating hole including an opening having a first area and a second penetrating hole including an opening having a second area smaller than the first area of the opening are formed in the partition wall, and
the first and second penetrating holes are formed at different positions in a longitudinal direction of an upper edge of the partition wall.

8. An electronic device comprising:
the case according to claim 7; and
a heat-generating element, wherein
the second penetrating hole is disposed closer to the heat-generating element than the first penetrating hole is.

* * * * *